United States Patent
Kanaoka et al.

(10) Patent No.: US 9,863,064 B2
(45) Date of Patent: Jan. 9, 2018

(54) SURFACE-COATED CUTTING TOOL

(71) Applicant: SUMITOMO ELECTRIC HARDMETAL CORP., Itami-shi (JP)

(72) Inventors: Hideaki Kanaoka, Sorachi-gun (JP); Shinya Imamura, Sorachi-gun (JP); Anongsack Paseuth, Sorachi-gun (JP); Takanori Detani, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 0 days.

(21) Appl. No.: 15/320,914

(22) PCT Filed: Jun. 21, 2016

(86) PCT No.: PCT/JP2016/068421
§ 371 (c)(1),
(2) Date: Dec. 21, 2016

(87) PCT Pub. No.: WO2017/061144
PCT Pub. Date: Apr. 13, 2017

(65) Prior Publication Data
US 2017/0268124 A1 Sep. 21, 2017

(30) Foreign Application Priority Data
Oct. 9, 2015 (WO) .................. PCT/JP2015/078838

(51) Int. Cl.
*B23B 27/14* (2006.01)
*C30B 29/20* (2006.01)
(Continued)

(52) U.S. Cl.
CPC ............ *C30B 29/20* (2013.01); *B23B 27/148* (2013.01); *C23C 16/36* (2013.01); *C30B 28/14* (2013.01);
(Continued)

(58) Field of Classification Search
USPC .......... 51/307, 309; 428/216, 336, 698, 699, 428/701, 702
See application file for complete search history.

(56) References Cited

U.S. PATENT DOCUMENTS

2007/0104945 A1 5/2007 Ruppi
2008/0187774 A1 8/2008 Ruppi
(Continued)

FOREIGN PATENT DOCUMENTS

JP  H11-335816 A  12/1999
JP  2004-188502 A  7/2004
(Continued)

OTHER PUBLICATIONS

International Search Report in counterpart International Patent Application No. PCT/JP2016/068421, dated Aug. 16, 2016.

*Primary Examiner* — Archene Turner
(74) *Attorney, Agent, or Firm* — Venable LLP; Michael A. Sartori; Miguel A. Lopez

(57) ABSTRACT

A surface-coated cutting tool includes a base material and a coating formed on the base material. The coating includes an $\alpha\text{-}Al_2O_3$ layer. The $\alpha\text{-}Al_2O_3$ layer contains a plurality of $\alpha\text{-}Al_2O_3$ crystal grains and a plurality of $\kappa\text{-}Al_2O_3$ crystal grains, and has a TC(006) of more than 5 in a texture coefficient TC(hkl). A ratio of $C_\kappa$ to a sum of $C_\alpha$ and $C_\kappa$: $[C_\kappa/(C_\alpha+C_\kappa)\times100](\%)$ is 0.05 to 7%, where $C_\alpha$ is a total number of peak counts of the $\alpha\text{-}Al_2O_3$ crystal grains obtained from measurement data of x-ray diffraction for the coating, and $C_\kappa$ is a total number of peak counts of the $\kappa\text{-}Al_2O_3$ crystal grains obtained from the measurement data of the x-ray diffraction for the coating.

4 Claims, 1 Drawing Sheet

(51) Int. Cl.
*C23C 16/36* (2006.01)
*C30B 28/14* (2006.01)

(52) U.S. Cl.
CPC ....... *B23B 2224/04* (2013.01); *B23B 2224/28* (2013.01); *B23B 2224/36* (2013.01); *B23B 2228/04* (2013.01); *B23B 2228/105* (2013.01)

(56) References Cited

U.S. PATENT DOCUMENTS

2009/0098355 A1\* 4/2009 Larsson .................. C22C 29/08
  428/216
2010/0330360 A1\* 12/2010 Tanibuchi ........... C23C 16/0272
  428/332

FOREIGN PATENT DOCUMENTS

| | | |
|---|---|---|
| JP | 2005-298239 A | 10/2005 |
| JP | 2007-125686 A | 5/2007 |
| JP | 2008-246664 A | 10/2008 |
| JP | 2011-194519 A | 10/2011 |
| JP | 2014-136268 A | 7/2014 |

\* cited by examiner

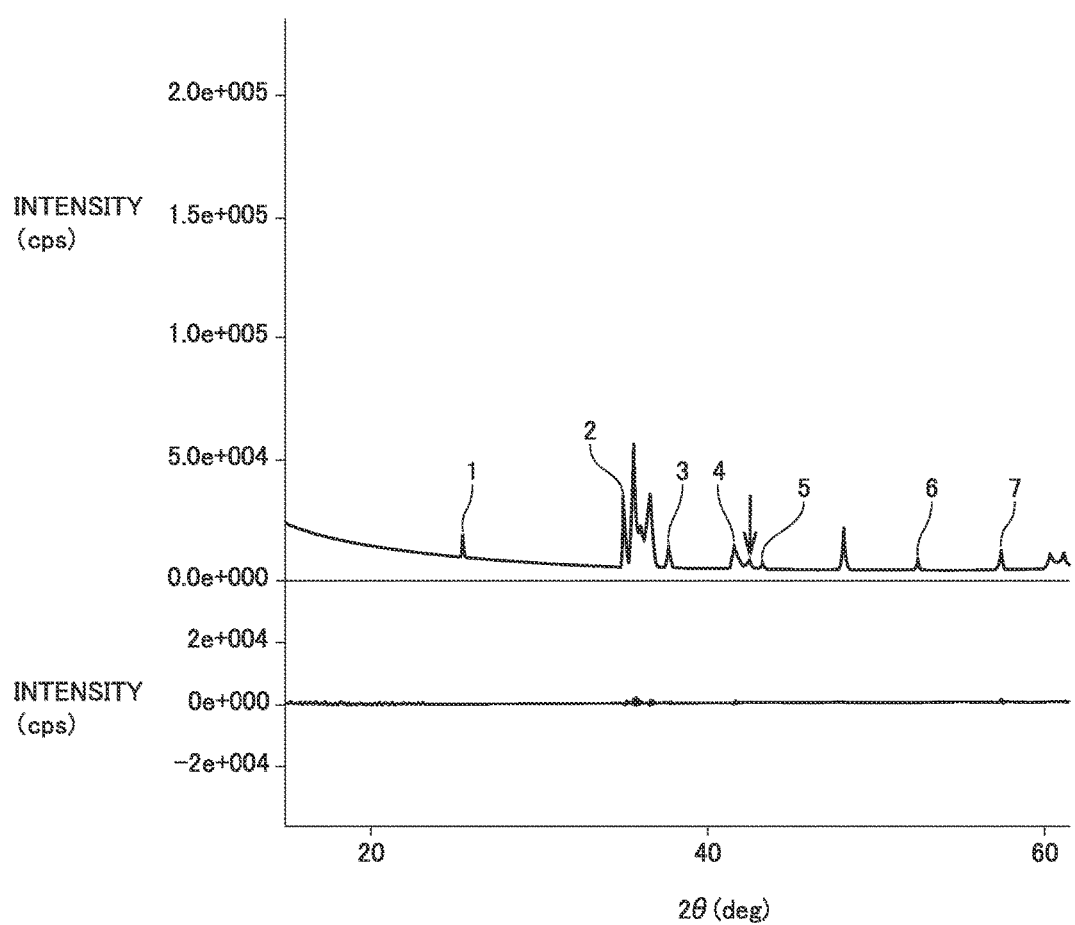

SURFACE-COATED CUTTING TOOL

TECHNICAL FIELD

The present invention relates to a surface-coated cutting tool.

BACKGROUND ART

A surface-coated cutting tool having a coating formed on a base material has conventionally been used. Recently, various techniques have been proposed for enhancing the performance of the surface-coated cutting tool, such as a technique for improving the quality of the coating by changing the crystallographic texture of $Al_2O_3$. For example, Japanese Patent Laying-Open No. 2008-246664 (PTD 1) proposes a cutting tool including an $\alpha\text{-}Al_2O_3$ layer having the (006) texture on a base material of a cemented carbide.

Moreover, Japanese Patent Laying-Open No. 11-335816 (PTD 2) proposes a cutting tool including an $Al_2O_3$ layer having a region in which $\alpha\text{-}Al_2O_3$ crystal grains are mixed with $\kappa\text{-}Al_2O_3$ crystal grains on a base material of a cemented carbide.

CITATION LIST

Patent Document

PTD 1: Japanese Patent Laying-Open No. 2008-246664
PTD 2: Japanese Patent Laying-Open No. 11-335816

SUMMARY OF INVENTION

Technical Problem

The cutting tools disclosed in above-referenced PTD 1 and PTD 2, however, have a problem that when an attempt is made to increase the wear resistance, the chipping resistance is not sufficiently increased and, when an attempt is made to increase the chipping resistance, the wear resistance is not sufficiently increased.

The present invention has been made in view of the above-described circumstances, and an object of the present invention is to provide a surface-coated cutting tool which can achieve an extended life by its coating formed to have both excellent wear resistance and excellent chipping resistance.

Solution to Problem

A surface-coated cutting tool according to an aspect of the present invention includes a base material and a coating formed on the base material. The coating includes an $\alpha\text{-}Al_2O_3$ layer. The $\alpha\text{-}Al_2O_3$ layer contains a plurality of $\alpha\text{-}Al_2O_3$ crystal grains and a plurality of $\kappa\text{-}Al_2O_3$ crystal grains, and has a TC(006) of more than 5 in a texture coefficient TC(hkl). A ratio of $C_\kappa$ to a sum of $C_\alpha$ and $C_\kappa$: $[C_\kappa/(C_\alpha+C_\kappa)\times100]$(%) is 0.05 to 7%, where $C_\alpha$ is a total number of peak counts of the $\alpha\text{-}Al_2O_3$ crystal grains obtained from measurement data of x-ray diffraction for the coating, and $C_\kappa$ is a total number of peak counts of the $\kappa\text{-}Al_2O_3$ crystal grains obtained from the measurement data of the x-ray diffraction for the coating.

Advantageous Effects of Invention

Accordingly, both the excellent wear resistance and the excellent chipping resistance are exhibited, and the life can be extended.

BRIEF DESCRIPTION OF DRAWINGS

FIG. 1 is a diagram showing an example of the XRD pattern based on an x-ray diffraction (XRD) method for a coating of a surface-coated cutting tool according to an aspect of the present invention.

DESCRIPTION OF EMBODIMENTS

Description of Embodiment of the Invention

The inventors of the present invention have thoroughly conducted studies for solving the above-described problem, and finally reached the present invention. During nucleation of $\alpha\text{-}Al_2O_3$ crystal grains, a large amount of CO was introduced in a pulsed form to thereby allow $\kappa\text{-}Al_2O_3$ crystal grains to be mixed at a specific ratio in an $\alpha\text{-}Al_2O_3$ layer. It has been found that both the excellent wear resistance and the excellent chipping resistance are thus exhibited.

First of all, the present invention will be described based on features listed below.

[1] A surface-coated cutting tool according to an aspect of the present invention includes a base material and a coating formed on the base material. The coating includes an $\alpha\text{-}Al_2O_3$ layer. The $\alpha\text{-}Al_2O_3$ layer contains a plurality of $\alpha\text{-}Al_2O_3$ crystal grains and a plurality of $\kappa\text{-}Al_2O_3$ crystal grains, and has a TC(006) of more than 5 in a texture coefficient TC(hkl). A ratio of $C_\kappa$ to a sum of $C_\alpha$ and $C_\kappa$: $[C_\kappa/(C_\alpha+C_\kappa)\times100]$(%) is 0.05 to 7%, where $C_\alpha$ is a total number of peak counts of the $\alpha\text{-}Al_2O_3$ crystal grains obtained from measurement data of x-ray diffraction for the coating, and $C_\kappa$ is a total number of peak counts of the $\kappa\text{-}Al_2O_3$ crystal grains obtained from the measurement data of the x-ray diffraction for the coating. The surface-coated cutting tool having the above features can have excellent wear resistance and excellent chipping resistance.

[2] Preferably, the $\alpha\text{-}Al_2O_3$ layer has an average layer thickness of 2 to 15 µm. Accordingly, both the wear resistance and the chipping resistance can be achieved.

[3] Preferably, in a surface of the coating, an outermost surface layer in which any one of Ti carbide, Ti nitride, and Ti boride is a main component is disposed. Accordingly, identification of the corner of the tool is facilitated.

[4] Preferably, the coating has an intermediate layer between the $\alpha\text{-}Al_2O_3$ layer and the base material, the intermediate layer contains acicular TiCNO or acicular TiBN and has an average layer thickness of 0.3 to 1 µm, and a difference between a maximum thickness and a minimum thickness of the intermediate layer is 0.3 µm or more. Accordingly, the adhesion of the $\alpha\text{-}Al_2O_3$ layer in the coating can be improved.

[5] Preferably, in the $\alpha\text{-}Al_2O_3$ layer, an area ratio X of the $\kappa\text{-}Al_2O_3$ crystal grains to all $Al_2O_3$ crystal grains in a measurement field of view is 0.1 to 20%. The measurement field of view is derived from an analysis with an electron backscatter diffraction apparatus for a region from a front surface of the $\alpha\text{-}Al_2O_3$ layer inward to a depth of 1 µm. Accordingly, with the excellent wear resistance and the excellent chipping resistance maintained, generation of cracks in the coating in an initial stage of cutting can effectively be suppressed.

[6] Preferably, in the $\alpha$-$Al_2O_3$ layer, an area ratio Y of the $\kappa$-$Al_2O_3$ crystal grains to all $Al_2O_3$ crystal grains in a measurement field of view is smaller than the area ratio X. The measurement field of view is derived from an analysis with the electron backscatter diffraction apparatus for a region beyond the region from the front surface of the $\alpha$-$Al_2O_3$ layer inward to the depth of 1 µm. Accordingly, with the excellent wear resistance and the excellent chipping resistance maintained, generation of cracks in the coating in an initial stage of cutting can more effectively be suppressed.

Details of Embodiment of the Invention

In the following, an embodiment of the present invention (hereinafter also referred to as "present embodiment") will be described in further detail.

<Surface-Coated Cutting Tool>

A surface-coated cutting tool of the present embodiment includes a base material and a coating formed on the base material. The coating preferably covers the entire surface of the base material. However, even the cutting tool in which a part of the base material is not covered with this coating or the structure and makeup of the coating is partially different does not go beyond the scope of the present invention.

The surface-coated cutting tool of the present embodiment can suitably be used as a cutting tool such as drill, end mill, indexable insert for the drill, indexable insert for the end mill, indexable insert for milling, indexable insert for turning, metal-slitting saw, gear-cutting tool, reamer, tap, or the like.

<Base Material>

As the base material, any base material conventionally known as a base material of this type may be used. For example, the base material is preferably any of a cemented carbide (including, for example, a WC-based cemented carbide, a cemented carbide containing WC and Co, and a cemented carbide containing WC and Co and additionally a carbonitride of Ti, Ta, Nb or the like), a cermet (having a main component such as TiC, TiN, TiCN or the like), a high-speed steel, a ceramic material (such as titanium carbide, silicon carbide, silicon nitride, aluminum nitride, aluminum oxide, and the like), cubic boron nitride sintered body, and a diamond sintered body.

Among these variety of base materials, the cemented carbide, particularly WC-based cemented carbide, or the cermet (particularly TiCN-based cermet) is preferably selected. These base materials are particularly excellent in balance between hardness and strength at high temperature, and have excellent characteristics for the base material of the surface-coated cutting tool for the above-described use.

In the case where the surface-coated cutting tool is an indexable insert or the like, the base material may have or may not have a chip breaker. Moreover, the shape of the edge ridgeline may be any of a sharp edge (the ridge where the rake face and the flank face meet each other), a honed edge (a sharp edge processed to be rounded), a negative land (beveled), and a combination of the honed edge and the negative land.

<Coating>

The coating includes an $Al_2O_3$ layer. For example, the coating may be made up of a plurality of layers including at least one $\alpha$-$Al_2O_3$ layer and further including other layers.

Examples of the aforementioned other layers may be TiCNO layer or TiBN layer, TiC layer, TiN layer, TiAlN layer, TiSiN layer, AlCrN layer, TiAlSiN layer, TiAlNO layer, AlCrSiCN layer, TiCN layer, TiSiC layer, CrSiN layer, AlTiSiCO layer, TiSiCN layer, and the like. A compound expressed herein by a chemical formula like the above-referenced ones includes the compound with any of all conventionally known atomic ratios if the atomic ratio is not particularly limited, and the compound is not necessarily limited to the compound with a stoichiometric ratio.

For example, in the case of an expression "TiAlN," the ratio of the number of atoms between the elements constituting TiAlN is not limited to Ti:Al:N=0.5:0.5:1, and includes all conventionally known ratios of the number of atoms. This is applied as well to any expressions of compounds other than "TiAlN." Moreover, in the present embodiment, the metal element such as Ti, Al, Si, Zr, or Cr and the non-metal element such as N (nitrogen), O (oxygen), or C (carbon) may not necessarily constitute a stoichiometric composition.

The coating has an average thickness of 3 to 35 µm (3 µm or more and 35 µm or less, it should be noted that a numerical value range expressed with "-" or "to" herein includes the numerical values of the upper limit and the lower limit). Preferably, the coating has an average thickness of 5 to 20 µm. If this average thickness is less than 3 µm, there is a possibility that the wear resistance is insufficient. If this average thickness is more than 35 µm, there is a possibility that the coating is peeled off or broken highly frequently when a large stress is applied between the coating and the base material during intermittent processing.

<$\alpha$-$Al_2O_3$ Layer>

The $\alpha$-$Al_2O_3$ layer contains a plurality of $\alpha$-$Al_2O_3$ (aluminum oxide having an $\alpha$-type crystal structure) crystal grains and a plurality of $\kappa$-$Al_2O_3$ (aluminum oxide having a $\kappa$-type crystal structure) crystal grains. Namely, this layer includes polycrystalline $\alpha$-$Al_2O_3$ containing a plurality of $\alpha$-$Al_2O_3$ crystal grains, and polycrystalline $\kappa$-$Al_2O_3$ containing a plurality of $\kappa$-$Al_2O_3$ crystal grains. The $\alpha$-$Al_2O_3$ crystal grains usually have a grain size on the order of 0.1 to 2 µm. The $\kappa$-$Al_2O_3$ crystal grains usually have a grain size on the order of 0.01 to 1 µm.

<TC(006) of $\alpha$-$Al_2O_3$ Layer>

The $\alpha$-$Al_2O_3$ layer has a TC(006) of more than 5 in texture coefficient TC(hkl) expressed by the following expression (1).

$$TC(hkl) = \frac{I(hkl)}{I_0(hkl)} \left\{ \frac{1}{n} \sum_1^n \frac{I(hkl)}{I_0(hkl)} \right\}^{-1} \quad (1)$$

In the expression (1), I(hkl) represents an x-ray diffraction intensity of a (hkl) reflection plane, and $I_0$(hkl) represents a standard intensity according to PDF card No. 00-010-0173 of the ICDD. In the expression (1), n represents the number of reflections used for the calculation and is eight in the present embodiment. (hkl) planes used for reflection are (012), (104), (110), (006), (113), (024), (116), and (300).

ICDD (registered trademark) is an abbreviation for International Center of Diffraction Data. PDF (registered trademark) is an abbreviation for Power Diffraction File.

TC(006) of the $\alpha$-$Al_2O_3$ layer in the present embodiment can be expressed by the following expression (2).

$$TC(006) = \frac{I(006)}{I_0(006)} \left\{ \frac{1}{8} \sum_{1}^{8} \frac{I(hkl)}{I_0(hkl)} \right\}^{-1} \quad (2)$$

Therefore, "TC(006) of more than 5 in texture coefficient TC(hkl)" means that a numerical value given by the above expression (2) which is determined by substituting TC(006) in the expression (1) is more than 5. The $\alpha$-$Al_2O_3$ layer having a value of TC(006) of more than 5 has effective hardness and Young's modulus against impact and vibration under severe cutting conditions, and therefore can contribute to improvement of the wear resistance.

The value of TC(006) is preferably more than 6 and more preferably more than 7. A greater value of TC(006) enables effective improvement of the wear resistance. While the upper limit of the value of TC(006) is not limited, the upper limit may be 8 or less since the number of reflection planes used for the calculation is 8.

This TC(hkl) can be measured through an analysis by means of an x-ray diffractometer. TC(hkl) can for example be measured by means of SmartLab (registered trademark) manufactured by Rigaku Corporation (scanning speed: 21.7°/min, step: 0.01°, scanning range: 15 to 140°) under the following conditions. It should be noted that the result of measurement of the TC(hkl) by means of the x-ray diffractometer is herein referred to as "XRD result."

characteristic x-ray: Cu-K$\alpha$
tube voltage: 45 kV
tube current: 200 mA
filter: multilayer mirror
optical system: focusing method
x-ray diffraction method: $\theta$-2$\theta$ method When the x-ray diffractometer is used, the x-ray may be applied to the flank face of the surface-coated cutting tool or the x-ray may be applied to the rake face of the surface-coated cutting tool. However, usually the rake face is formed to be uneven while the flank face is flat, and therefore, in order to eliminate disturbance factors, the x-ray is preferably applied to the flank face. In particular, the x-ray is preferably applied to a region on the flank face extending approximately 2 to 4 mm from the edge ridgeline, since a high reproducibility of the results is obtained in this way.

<Area Ratio of $\kappa$-$Al_2O_3$ Crystal Grains>

In the present embodiment, a ratio of $C_\kappa$ to a sum of $C_\alpha$ and $C_\kappa$: [$C_\kappa/(C_\alpha+C_\kappa)\times100$](%) is 0.05 to 7%, where $C_\alpha$ is a total number of peak counts of the $\alpha$-$Al_2O_3$ crystal grains obtained from measurement data of x-ray diffraction for the coating, and $C_\kappa$ is a total number of peak counts of the $\kappa$-$Al_2O_3$ crystal grains obtained from the measurement data of the x-ray diffraction for the coating.

Namely, the measurement data of x-ray diffraction for the coating can be used to define, by the following expression (3), the ratio of the area occupied by the $\kappa$-$Al_2O_3$ crystal grains in the $\alpha$-$Al_2O_3$ layer to the sum of the area occupied by the $\alpha$-$Al_2O_3$ crystal grains in the $Al_2O_3$ layer and the area occupied by the $\kappa$-$Al_2O_3$ crystal grains (the ratio is hereinafter referred to as "area ratio of $\kappa$-$Al_2O_3$ crystal grains). Thus, the area ratio of $\kappa$-$Al_2O_3$ crystal grains is derived from the following expression (3) and falls in a range of 0.05 to 7%.

$$\frac{C_\kappa}{C_\alpha + C_\kappa} \times 100 \quad (3)$$

In the expression (3), $C_\alpha$ is the number of peak counts of the $\alpha$-$Al_2O_3$ crystal grains obtained from measurement data of x-ray diffraction for the coating, and $C_\kappa$ is the number of peak counts of the $\kappa$-$Al_2O_3$ crystal grains obtained from the measurement data of the x-ray diffraction for the coating.

The number of peak counts can be calculated by means of an x-ray diffractometer. For example, similarly to the above-described measurement of TC(hkl), the number of peak counts can be calculated by means of SmartLab (registered trademark) manufactured by Rigaku Corporation (scanning speed: 21.7°/min, step: 0.01°, scanning range: 15 to 140°). Then, measurement can be performed under the same conditions as those of the measurement of TC(hkl). Based on the obtained data of x-ray diffraction for the coating, the number of peak counts can be calculated. When the number of peak counts is to be calculated as well, the x-ray may be applied to the flank face of the surface-coated cutting tool or the x-ray may be applied to the rake face thereof, similarly to the above-described measurement of TC(hkl).

FIG. 1 is an example of the x-ray diffraction (XRD) pattern of the coating measured by the XRD method. From the XRD pattern in FIG. 1, seven peaks are identified in total as peaks of $\alpha$-$Al_2O_3$ crystal grains, namely first peak 1, second peak 2, third peak 3, fourth peak 4, fifth peak 5, sixth peak 6, and seventh peak 7 in order from the 0° side on the horizontal axis 2$\theta$. $C_\alpha$ calculated from these peaks is 63001. The peak of $\kappa$-$Al_2O_3$ crystal grains is identified as one peak indicated by the arrow in FIG. 1. $C_\kappa$ calculated from this peak is 2624.

These numerical values of $C_\alpha$ and $C_\kappa$ are substituted into the above expression (3). Then, the calculated ratio is 4%. Namely, based on the above expression (3), $\kappa$-$Al_2O_3$ crystal grains can be identified as being present at an area ratio of 4% in the $\alpha$-$Al_2O_3$ layer in the coating exemplarily shown in FIG. 1.

The aforementioned ratio [$C_\kappa/(C_\alpha+C_\kappa)\times100$](%) is preferably 0.05 to 5%, and more preferably 0.7 to 4.8%. Accordingly, particularly excellent chipping resistance can be obtained. If this ratio is less than 0.05%, there is a possibility that the chipping resistance is lowered. If this ratio is more than 7%, there is a possibility that the wear resistance is adversely influenced.

The $\alpha$-$Al_2O_3$ layer has an average layer thickness of preferably 1 to 15 μm. Accordingly, both the wear resistance and the chipping resistance can be achieved. Further, the average layer thickness is more preferably 2 to 15 μm, and particularly preferably 3 to 10 If the average layer thickness is less than 1 there is a possibility that wear is apt to increase. If the average layer thickness is more than 15 there is a possibility that the chipping resistance is lowered.

<Area Ratio of $\kappa$-$Al_2O_3$ Crystal Grains in Two Regions of $\alpha$-$Al_2O_3$ Layer>

In the present embodiment, in the $\alpha$-$Al_2O_3$ layer, an area ratio X of the $\kappa$-$Al_2O_3$ crystal grains to all $Al_2O_3$ crystal grains in a measurement field of view is preferably 0.1 to 20%. This measurement field of view is derived from an analysis with an electron backscatter diffraction (EBSD) apparatus for a region from a front surface of the $\alpha$-$Al_2O_3$ layer inward to a depth of 1 μm. More preferably, in the $\alpha$-$Al_2O_3$ layer, an area ratio Y of the $\kappa$-$Al_2O_3$ crystal grains to all $Al_2O_3$ crystal grains in a measurement field of view is smaller than the area ratio X. This measurement field of view is derived from an analysis with the electron backscatter diffraction apparatus for a region beyond the region from the front surface of the $\alpha$-$Al_2O_3$ layer inward to the depth of 1 μm.

Accordingly, in a front-side region of the $\alpha$-$Al_2O_3$ layer, the ratio of the $\kappa$-$Al_2O_3$ crystal grains to all $Al_2O_3$ crystal grains is higher. It is known that $\kappa$-$Al_2O_3$ crystal grains are softer and more flexible than $\alpha$-$Al_2O_3$ crystal grains. Therefore, the higher ratio of the κ-$Al_2O_3$ crystal grains makes it possible to effectively suppress generation of cracks in the coating in an initial stage of cutting in which the cutting tool is most heavily loaded. Thus, the α-$Al_2O_3$ layer is made up of two regions. One is a region from the front surface of the α-$Al_2O_3$ layer inward to a depth of 1 μm. The other is a region beyond the region from the front surface of the α-$Al_2O_3$ layer inward to the depth of 1 μm.

The aforementioned XRD apparatus analyzes the x-ray transmitted through the coating which includes the α-$Al_2O_3$ layer. Therefore, the ratio [$C_κ/(C_α+C_κ)×100$](%) is obtained as a ratio in the whole α-$Al_2O_3$ layer. In contrast, the EBSD apparatus applies an electron beam to a cross section including the α-$Al_2O_3$ layer and analyzes back scattered electrons reflected therefrom, as described later herein. Therefore, sites on the cross section to be analyzed may be adjusted, for example, to obtain the ratio of κ-$Al_2O_3$ crystal grains to all $Al_2O_3$ crystal grains in a measurement field of view (the ratio is represented as an area ratio, since this is obtained by EBSD), for each of the two regions of the α-$Al_2O_3$ layer which appear on the cross section.

The front surface of the α-$Al_2O_3$ layer refers to the uppermost portion of the α-$Al_2O_3$ layer located on the coating front side. When another layer is formed on the α-$Al_2O_3$ layer, the front surface refers to the interface between the other layer and the α-$Al_2O_3$ layer. When another layer is not formed on the α-$Al_2O_3$ layer, the front surface refers to the front surface of the coating. Moreover, the end on the base-material-side of the region for which the area ratio Y is calculated, namely the region beyond the region from the front surface of the α-$Al_2O_3$ layer inward to the depth of 1 μm, is the lowermost portion of the α-$Al_2O_3$ layer located on the base-material-side. When another layer is formed between the α-$Al_2O_3$ layer and the base material, the end refers to the interface between the other layer and the α-$Al_2O_3$ layer. When the α-$Al_2O_3$ layer is in direct contact with the base material, the end refers to the interface between the base material and the α-$Al_2O_3$ layer.

In the present embodiment, for measurement of the area ratio of the κ-$Al_2O_3$ crystal grains in each of the two regions of the α-$Al_2O_3$ layer as described above, a field emission scanning electron microscope (FE-SEM) equipped with an EBSD apparatus is used. Specifically, at least the α-$Al_2O_3$ layer is cut in parallel to the normal direction to the front surface of the base material. The resultant cross section is polished. The polished cross section is used as a measurement surface. The area ratio of the κ-$Al_2O_3$ crystal grains in the α-$Al_2O_3$ layer included in the polished cross section is measured. The polished cross section can be obtained by polishing the cross section with waterproof abrasive paper and further performing ion milling with argon ions.

A method of polishing for preparing the polished cross section for which the area ratio of the κ-$Al_2O_3$ crystal grains is to be measured is as follows.

First, the α-$Al_2O_3$ layer is formed based on a manufacturing method described later herein. This α-$Al_2O_3$ layer is cut so that a cross section parallel to the normal direction to the front surface of the base material is obtained. After this, the cross section obtained by the cutting is polished with waterproof abrasive paper (including an SiC abrasive as an abrasive).

The above-described cutting is done in the following way. For example, the front surface of the α-$Al_2O_3$ layer (front surface of the coating when another layer is formed on the α-$Al_2O_3$ layer) is adhered and fixed, with wax or the like, onto a sufficiently large flat plate for holding. After this, a cutter with a rotary blade is used to cut the α-$Al_2O_3$ layer in the direction perpendicular to the flat plate (cut with the rotary blade oriented in the direction as close as possible to the direction perpendicular to the flat plate). This is for the reason that the front surface of the base material is considered to be in parallel with the front surface of the α-$Al_2O_3$ layer (front surface of the coating). As long as the α-$Al_2O_3$ layer is cut perpendicularly to the flat plate as described above, the α-$Al_2O_3$ layer may be cut at any site. The cross section thus obtained is polished and smoothed as described below to thereby prepare the polished cross section.

Polishing is performed with the aforementioned waterproof abrasive paper #400, #800, and #1500 in order (the number (#) of the waterproof abrasive paper is used to indicate difference in particle size of the abrasive. A larger number represents a smaller particle size of the abrasive).

Subsequently, the cross section polished with the waterproof abrasive paper is subjected to ion milling with Ar ions to be further smoothed. The conditions for the ion milling are as follows, for example.

acceleration voltage: 6 kV
ion beam incident angle: 0° from the direction normal to the front surface of the base material
ion beam irradiation time: 6 hours After this, the polished cross section of the α-$Al_2O_3$ layer having been smoothed may be observed with the FE-SEM equipped with the EBSD apparatus. The observation may be conducted by individually directing a focused electron beam onto each pixel and successively collecting EBSD data. For example, the FE-SEM (trademark: "Zeiss Supra 35 VP" manufactured by Carl Zeiss) equipped with HKL NL02 EBSD detector may be used.

The observation of the polished cross section with the FE-SEM equipped with the EBSD apparatus is as follows. Based on an automatic analysis of a Kikuchi diffraction pattern generated by backscattering electrons, the EBSD apparatus can measure the crystal structure of crystal grains as well as the crystal orientation in which the crystal grains are oriented. Therefore, the area ratio of the κ-$Al_2O_3$ crystal grains can be determined in the following way. Namely, the FE-SEM equipped with the EBSD apparatus is used to take a picture of the polished cross section, and the type of $Al_2O_3$ crystal grains appearing on each pixel in the picture (image i.e., field of view) is identified. Then, the ratio is calculated of the area occupied by the κ-type crystal grains (the number of pixels identified as κ-$Al_2O_3$ crystal grains) to the area occupied by all $Al_2O_3$ crystal grains appearing on the picture image (the number of pixels identified as $Al_2O_3$ crystal grains).

Namely, the area ratio X means the area ratio of κ-$Al_2O_3$ crystal grains to all $Al_2O_3$ crystal grains included in a region from the front surface of the α-$Al_2O_3$ layer inward to a depth of 1 μm, in the picture image (in the measurement field of view). Further, the area ratio Y means the area ratio of κ-$Al_2O_3$ crystal grains to all $Al_2O_3$ crystal grains included in a region beyond the region from the front surface of the α-$Al_2O_3$ layer inward to the depth of 1 μm, in the picture image (in the measurement field of view).

Accordingly, in the α-$Al_2O_3$ layer of the present embodiment, the area ratio X is preferably in a range of 0.1 to 20%, for example. Further, the area ratio Y is preferably lower than the area ratio X. The area ratio X is more preferably in a range of 0.3 to 5%, and the area ratio Y is most preferably in a range of 0.01 to 0.3%.

For the measurement of the area ratio of the κ-$Al_2O_3$ crystal grains in the two regions of the α-$Al_2O_3$ layer, in order to ensure the accuracy of the measurement, the observation magnification of the FE-SEM is appropriately selected from a range of 3000× to 30000×, and the area to be observed in one field of view is appropriately selected from a range of 10 to 200 μm². More specifically, one field of view should include at least any measurement site of 1 μm (in the depth direction of the α-$Al_2O_3$ layer)×10 μm (in the direction perpendicular to the depth direction). Further, for calculation of the area ratio X of the κ-$Al_2O_3$ crystal grains, measurement is performed on at least three measurement sites in a region from the front surface of the α-$Al_2O_3$ layer inward to a depth of 1 μm, and the average value of respective measurement values is calculated to use the average value as the area ratio X. For calculation of the area ratio Y of the κ-$Al_2O_3$ crystal grains as well, measurement is performed on at least three measurement sites in a region beyond the region from the front surface of the α-$Al_2O_3$ layer inward to the depth of 1 μm, and the average value of respective measurement values is calculated to use the average value as the area ratio Y. It should be noted that the aforementioned measurement sites may be in the same field of view or different fields of view. In addition, if any measurement value is apparently abnormal, this value is discarded.

For calculation of the area ratio of the κ-$Al_2O_3$ crystal grains by means of the EBSD apparatus, commercially available software (trademark: "Orientation Imaging Microscopy Ver 6.2" manufactured by EDAX), for example, can be used.

<Other Layers>

The coating may include layers other than the α-$Al_2O_3$ layer as described above. The other layers may include a TiCN layer, for example. The TiCN layer may be disposed for example between the α-$Al_2O_3$ layer and the base material. This TiCN layer is excellent in wear resistance and therefore can provide higher wear resistance to the coating. The TiCN layer is particularly preferably formed by the MT-CVD (medium temperature CVD) method. The MT-CVD method can be used to form a layer at a relatively low temperature of about 850 to 900° C., and can reduce damage to the base material caused by heating in the process of forming the layer.

The average thickness of the TiCN layer is preferably 2 to 20 μm. If this average thickness is less than 2 μm, there is a possibility that wear is likely to increase. If this average thickness is more than 20 μm, there is a possibility that the chipping resistance is lowered. It should be noted that an outermost surface layer and an intermediate layer described below are also included in the other layers.

<Outermost Surface Layer>

Preferably, in a surface of the coating, an outermost surface layer in which any one of Ti (titanium) carbide, Ti nitride, and Ti boride is a main component is disposed. The outermost surface layer is a layer located at the outermost surface position in the coating. It should be noted, however, that the outermost surface layer may not be formed in a region including the edge ridgeline. In the case where other layers are not formed on the α-$Al_2O_3$ layer, the outermost surface layer is disposed directly on the α-$Al_2O_3$ layer.

"Any one of Ti carbide, Ti nitride, and Ti boride is a main component" means that the outermost surface layer contains 90 mass % or more of any one of Ti carbide, Ti nitride, and Ti boride. It preferably means that the outermost surface layer is made of any one of Ti carbide, Ti nitride, and Ti boride, besides inevitable impurities.

Among Ti carbide, Ti nitride, and Ti boride, Ti nitride (namely the compound expressed as TiN) is particularly preferred for use as a main component forming the outermost surface layer. Among these compounds, TiN assumes the most distinct color (assumes gold) and therefore has an advantage of making it easy to identify a corner (identify a used part) of a cutting insert after used for cutting.

The outermost surface layer preferably has an average thickness of 0.05 to 1 μm. The upper limit of the average thickness of the outermost surface layer is preferably 0.8 μm and more preferably 0.6 μm. The lower limit of the average thickness of the outermost surface layer is preferably 0.1 μm and more preferably 0.2 μm. If the average thickness is less than 0.05 μm, there is a possibility that its effect is not sufficiently provided when a compressive residual stress is applied to the coating and thus the chipping resistance is not improved. If the average thickness is more than 1 μm, there is a possibility that the adhesion between the outermost surface layer and a layer adjacent to the outermost surface layer is deteriorated.

<Intermediate Layer>

Preferably, the coating has an intermediate layer between the α-$Al_2O_3$ layer and the base material. The intermediate layer is formed to contain acicular TiCNO or acicular TiBN. For example, the intermediate layer is preferably disposed between the α-$Al_2O_3$ layer and a TiCN layer which is disposed between the α-$Al_2O_3$ layer and the base material, and more preferably disposed between the α-$Al_2O_3$ layer and the TiCN layer and in contact with both the α-$Al_2O_3$ layer and the TiCN layer, since the adhesion of the α-$Al_2O_3$ layer in the coating is increased. The intermediate layer may be formed by any known method. It should be noted that "acicular" herein refers to "acicular" shape of TiCNO and TiBN crystal grains.

The intermediate layer preferably has an average thickness of 0.3 to 1 μm, since the adhesion of the α-$Al_2O_3$ layer in the coating is further increased. The average thickness of the intermediate layer is more preferably 0.4 to 0.8 μm. Further, a difference between a maximum thickness and a minimum thickness of the intermediate layer is preferably 0.3 μm or more. Accordingly, increase of the adhesion of the α-$Al_2O_3$ layer in the coating can be ensured. If the difference between the maximum thickness and the minimum thickness of the intermediate layer is less than 0.3 μm, there is a possibility that the effect of increasing the adhesion of the α-$Al_2O_3$ layer is not sufficiently obtained. The upper limit of the difference between the maximum thickness and the minimum thickness of the intermediate layer is 0.9 μm. If the difference is more than the upper limit 0.9 μm, there is a possibility that the α-$Al_2O_3$ crystal grains are non-uniform and the adhesion between the intermediate layer and the α-$Al_2O_3$ layer is deteriorated.

The thickness of the intermediate layer can be measured by polishing a cross section of the coating which is parallel to a perpendicular cross section of the α-$Al_2O_3$ layer by ion milling, and observing the polished cross section with a field emission scanning electron microscope.

The conditions for the ion milling are as follows, for example.

acceleration voltage: 6 kV
ion beam incident angle: 0 to 5° from the normal line
ion beam irradiation time: 300 minutes The average thickness of the intermediate layer can be determined for example in the following way. The above-described measurement method measures the thickness of the intermediate layer at multiple locations on the intermediate layer. Thus, from these locations, any several locations are selected. Respective thicknesses at these several locations can be averaged to determine the average thickness of the intermediate layer. The maximum thickness and the minimum thickness of the intermediate layer can also be determined by taking the maximum thickness and the minimum thickness from thicknesses at multiple locations on the intermediate layer measured by the above-described measurement method.

<Method of Manufacturing Coating>

The surface-coated cutting tool in the present embodiment can appropriately be manufactured by forming a coating on a base material by the chemical vapor deposition (CVD) method. In the case where the CVD method is used, the deposition temperature is 800 to 1200° C. which is higher than the temperature for the physical vapor deposition method and thus the adhesion between the coating and the base material is improved. In the case where layers other than the $\alpha$-$Al_2O_3$ layer are formed as layers of the coating, these layers may be formed under conventionally known conditions.

The $\alpha$-$Al_2O_3$ layer can be formed in the following manner by means of the CVD method for example.

First, by a known method, a TiCN layer is formed on another layer formed on the base material or a TiCN layer is formed on the base material without another layer interposed therebetween, and a TiCNO layer is formed on a surface of the TiCN layer. Further, a surface of the TiCNO layer is oxidized to cause nucleation of $\alpha$-$Al_2O_3$ crystal grains. Subsequently, an $\alpha$-$Al_2O_3$ layer is formed ($\alpha$-$Al_2O_3$ crystal is grown). For nucleation of $\alpha$-$Al_2O_3$ crystal grains and formation of the $\alpha$-$Al_2O_3$ layer (growth of $\alpha$-$Al_2O_3$ crystal), the content of CO gas contained in a raw material gas to be introduced is set to a content selected from a range of 1 to 5 vol %. The content of each gas in the raw material gas other than the CO gas is 1.3 to 2.5 vol % of $AlCl_3$, 2.8 to 6 vol % of HCl, 0.4 to 3 vol % of $CO_2$, 0.002 to 0.008 vol % of $O_2$, and the remainder of $H_2$. The temperature in a furnace of a CVD apparatus is 970 to 1020° C. and the pressure in the furnace is 70 to 110 hPa.

During nucleation of the $\alpha$-$Al_2O_3$ crystal grains, the raw material gas is introduced in which the content of CO gas contained in the raw material gas is increased momentarily (in pulsed manner) from the content selected from a range of 1 to 5 vol %. Namely, firstly the content of CO gas is changed in pulsed manner to cause nucleation of the $\alpha$-$Al_2O_3$ crystal grains, and thereafter the raw material gas having the above-described composition is used to grow the $\alpha$-$Al_2O_3$ crystal grains and form the $\alpha$-$Al_2O_3$ layer. In this way, the $\alpha$-$Al_2O_3$ layer can be formed in which $\kappa$-$Al_2O_3$ crystal grains are mixed with a large number of $\alpha$-$Al_2O_3$ crystal grains. It should be noted in the case where the content of CO gas is momentarily increased during nucleation, the increase may be adjusted by decreasing the content of $H_2$ gas which is the remainder in the raw material gas. This is convenient since respective contents of the other gases, the temperature in the furnace of the CVD apparatus, and the pressure in the furnace can be kept constant.

Preferably, the momentarily increased content (pulse height) of CO gas is 130 to 160% relative to the content selected from a range of 1 to 5 vol %. If this is less than 130%, the area ratio of $\kappa$-$Al_2O_3$ crystal grains calculated based on the above expression (3) is less than 0.05% and thus there is a possibility that the chipping resistance is lowered. If this is more than 160%, the area ratio of $\kappa$-$Al_2O_3$ crystal grains is more than 7% and thus there is a possibility that excellent wear resistance cannot be obtained.

It has conventionally been pointed out that an excessively increased concentration of introduced CO gas causes increase of the area ratio of low-hardness $\kappa$-$Al_2O_3$ crystal grains to thereby lower the wear resistance. In the case of the surface-coated cutting tool in the present embodiment, the area ratio of $\kappa$-$Al_2O_3$ crystal grains can be controlled by introducing the CO gas so that the concentration is changed in pulsed manner even when the concentration of the introduced CO gas is high. Then, TC(006) which is determined based on the above expression (1) for the formed $\alpha$-$Al_2O_3$ layer is more than 5. The wear resistance can thus be improved. Moreover, in the $\alpha$-$Al_2O_3$ layer, the $\kappa$-$Al_2O_3$ crystal grains can be mixed at a ratio of 0.05 to 7% calculated based on the above expression (3). The chipping resistance can thus be improved.

Further, the surface-coated cutting tool in the present embodiment is preferably manufactured in the following way. During formation of the $\alpha$-$Al_2O_3$ layer subsequent to nucleation of $\alpha$-$Al_2O_3$ crystal grains, feeding of $CO_2$ gas is temporarily stopped at the time when the $\alpha$-$Al_2O_3$ layer is formed to a thickness of 50 to 90% relative to a desired thickness, and thereafter feeding of $CO_2$ gas is restarted. In this way, the area ratio of the $\kappa$-$Al_2O_3$ crystal grains in the front surface of the $\alpha$-$Al_2O_3$ layer can be increased. Thus, the surface-coated cutting tool can be manufactured in which generation of cracks in the coating is effectively suppressed in an initial stage of cutting in which the cutting tool is most heavily loaded.

When feeding of $CO_2$ gas is restarted after temporarily stopped, the content of $CO_2$ gas is set to the original content in the raw material gas (namely set to 0.4 to 3 vol %). After this, the raw material gas having the above-described composition is used to continue formation of the $\alpha$-$Al_2O_3$ layer. In this way, the $\alpha$-$Al_2O_3$ layer having the desired thickness can be formed. The time for which feeding of $CO_2$ gas is temporarily stopped is preferably 25 to 70 seconds, in order to set the area ratio of the $\kappa$-$Al_2O_3$ crystal grains in an appropriately range. Accordingly, in the $\alpha$-$Al_2O_3$ layer, an area ratio X of the $\kappa$-$Al_2O_3$ crystal grains of 0.1 to 20% to all $Al_2O_3$ crystal grains in a measurement field of view can be obtained. This area ratio X is obtained from an analysis with an electron backscatter diffraction apparatus for a region from a front surface of the $\alpha$-$Al_2O_3$ layer inward to a depth of 1 µm. Further, the area ratio X can be made higher than the area ratio Y of the $\kappa$-$Al_2O_3$ crystal grains to all $Al_2O_3$ crystal grains in a measurement field of view. This area ratio Y is obtained from an analysis with the electron backscatter diffraction apparatus for a region beyond the region from the front surface of the $\alpha$-$Al_2O_3$ layer inward to the depth of 1 µm.

Respective functions of CO gas and $CO_2$ gas contained in the raw material gas are now described. In the present embodiment, the content of CO gas is controlled to thereby allow $\kappa$-$Al_2O_3$ crystal grains to be mixed in the $\alpha$-$Al_2O_3$ layer during nucleation of $\alpha$-$Al_2O_3$ crystal grains. Further, during formation (growth of crystal grains) of the $\alpha$-$Al_2O_3$ layer, the content of $CO_2$ gas is controlled (feeding of $CO_2$ gas is temporarily stopped) to thereby increase the ratio of the $\kappa$-$Al_2O_3$ crystal grains to all $Al_2O_3$ crystal grains in the front surface of the $\alpha$-$Al_2O_3$ layer. CO gas has a function of suppressing reaction during formation of $\alpha$-$Al_2O_3$. Thus, CO gas suppresses generation of $\alpha$-$Al_2O_3$ crystal grains in the $\alpha$-$Al_2O_3$ layer during nucleation of the $\alpha$-$Al_2O_3$ crystal grains. Accordingly, the content of the CO gas is controlled (momentarily increased) during nucleation of the $\alpha$-$Al_2O_3$ crystal grains to thereby enable the $\kappa$-$Al_2O_3$ crystal grains to be mixed at a predetermined ratio in the whole $\alpha$-$Al_2O_3$ layer. In contrast, $CO_2$ gas has a function of promoting reaction during formation of $\alpha$-$Al_2O_3$. Thus, $CO_2$ gas promotes generation (growth) of the $\alpha$-$Al_2O_3$ crystal grains in the $\alpha$-$Al_2O_3$ layer. Accordingly, the content of $CO_2$ gas is controlled (feeding thereof is temporarily stopped) during formation of the α-Al$_2$O$_3$ layer to thereby enable increase of the ratio of the κ-Al$_2$O$_3$ crystal grains to all Al$_2$O$_3$ crystal grains in the front surface of the α-Al$_2$O$_3$ layer.

It should be noted that the thickness of the α-Al$_2$O$_3$ layer and the thickness of each layer other than the α-Al$_2$O$_3$ layer can be adjusted by appropriately regulating the deposition time (the deposition rate for each layer is about 0.5 to 2 μm/hour).

EXAMPLES

In the following, the present invention will be described in further detail with reference to Examples. The present invention, however, is not limited to them.

Example 1

<Preparation of Base Material>

A base material formed of a cemented carbide base material (manufactured by Sumitomo Electric Industries, Ltd.) with a shape of CNMG120408 defined under JIS (Japanese Industrial Standard) B 4120 (1998) was prepared. Prepared base materials were grouped into eight groups named Sample A1 to Sample A8. For each group, three base materials were prepared. These base materials had a composition made up of 87.0 wt % of WC, 8.0 wt % of Co, 2.5 wt % of TiC, 1.5 wt % of NbC, and 1.0 wt % of TaC.

As will be described later herein, Sample A1 to Sample A3 are Examples and Sample A4 to Sample A8 are Comparative Examples.

<Formation of Coating>

The base materials of Sample A1 to Sample A8 were subjected to honing by a known method and set in a CVD apparatus, and a coating was formed on a surface of each base material by the CVD method. Regarding the conditions for forming the coating, the conditions for forming each layer except for the α-Al$_2$O$_3$ layer are indicated in the following Table 1.

of α-Al$_2$O$_3$ crystal grains, and subsequently the α-Al$_2$O$_3$ layer was formed. In particular, for nucleation of α-Al$_2$O$_3$ crystal grains and subsequent formation of the α-Al$_2$O$_3$ layer, the content of CO gas contained in the raw material gas to be introduced was set to 2 vol %. Respective contents of the constituent gases including CO gas in the composition of the raw material gas, as well as the temperature in a furnace of the CVD apparatus and the pressure in the furnace are indicated in Table 2 below.

It should be noted that, during nucleation of α-Al$_2$O$_3$ crystal grains, CO gas was introduced with its content momentarily made higher than 2 vol %. After this, the raw material gas in which the content of CO gas was set again to 2 vol % was used to grow α-Al$_2$O$_3$ crystal grains and form the α-Al$_2$O$_3$ layer.

Particularly in Example 1, the momentarily increased content (pulse height) of CO gas, the time (pulse width) for which the CO gas at the momentarily increased content was introduced, and the number of times the CO gas was introduced at the momentarily increased content were differently set for Sample A1 to Sample A7. Specifically, for Sample A1 to Sample A7, the pulse height was set to 150% or 170% with respect to the content of 2 vol % of the CO gas in the raw material gas, the pulse width was varied in a range of 0.5 to 1.5 minutes, and the number of times the CO gas was introduced at the momentarily increased content was set to two or three.

Moreover, Samples A1 to A7 were made different from Sample A8, in terms of the CO$_2$ content in the composition of the raw material gas. In terms of the composition of the raw material gas except for the CO$_2$ gas, and the temperature and the pressure in the furnace of the CVD apparatus, Samples A1 to A7 were identical to Sample A8. The conditions for Sample A8, such as pulse width and pulse height of the CO gas introduced at the momentarily increased content were set identical to those for Sample A2. These conditions are indicated in Table 2 below. "Pulse

TABLE 1

| | | conditions for forming layer | | |
|---|---|---|---|---|
| | composition of raw material gas (vol %) | temperature (° C.) | pressure (hPa) | total gas amount (L/min) |
| TiN (underlayer) | TiCl$_4$ = 2%, N$_2$ = 25%, H$_2$ = remainder | 900 | 200 | 60 |
| TiCN | TiCl$_4$ = 2%, CH$_3$CN = 0.5%, N$_2$ = 20%, H$_2$ = remainder | 850 | 80 | 95 |
| TiCNO | TiCl$_4$ = 1%, CO = 1%, CH$_4$ = 5%, N$_2$ = 10%, H$_2$ = remainder | 1000 | 250 | 60 |
| TiC | TiCl$_4$ = 2%, CH$_4$ = 7%, H$_2$ = remainder | 1000 | 500 | 60 |
| TiN (outermost surface layer) | TiCl$_4$ = 1.5%, N$_2$ = 40%, H$_2$ = remainder | 1000 | 800 | 90 |

In the process of forming the α-Al$_2$O$_3$ layer by the CVD method, the surface of the TiCNO layer formed on the surface of the TiCN layer was oxidized to cause nucleation period" in Table 2 refers to the period from the start time at which introduction of the CO gas at the momentarily increased content is started, to the next start time.

TABLE 2

| | Sample No. | temperature in furnace (° C.) | pressure in furnace (hPa) | CO$_2$ (vol %) | O$_2$ (vol %) | AlCl$_3$ (vol %) | HCl (vol %) | normal CO (vol %) | pulse height and number of times | pulse width (min) | pulse period (min) |
|---|---|---|---|---|---|---|---|---|---|---|---|
| Example | A1 | 1000 | 80 | 0.5 | 0.002 | 2 | 3 | 2 | 150%, 3 times | 0.5 | 5 |
| | A2 | 1000 | 80 | 0.5 | 0.002 | 2 | 3 | 2 | 150%, 3 times | 0.7 | 5 |
| | A3 | 1000 | 80 | 0.5 | 0.002 | 2 | 3 | 2 | 150%, 3 times | 1.3 | 5 |
| Comparative | A4 | 1000 | 80 | 0.5 | 0.002 | 2 | 3 | 2 | 150%, 3 times | 0.3 | 5 |
| Example | A5 | 1000 | 80 | 0.5 | 0.002 | 2 | 3 | 2 | 150%, 3 times | 1.5 | 5 |

TABLE 2-continued

| Sample No. | temperature in furnace (° C.) | pressure in furnace (hPa) | $CO_2$ (vol %) | $O_2$ (vol %) | $AlCl_3$ (vol %) | HCl (vol %) | normal CO (vol %) | pulse height and number of times | pulse width (min) | pulse period (min) |
|---|---|---|---|---|---|---|---|---|---|---|
| A6 | 1000 | 80 | 0.5 | 0.002 | 2 | 3 | 2 | 150%, 2 times | 0.5 | 5 |
| A7 | 1000 | 80 | 0.5 | 0.002 | 2 | 3 | 2 | 170%, 3 times | 0.5 | 5 |
| A8 | 1000 | 80 | 2 | 0.002 | 2 | 3 | 2 | 150%, 3 times | 0.7 | 5 |

The layer structure of the coating formed for each of Sample A1 to Sample A8 is made up of a TiN layer, a TiCN layer, a TiCNO layer, an α-$Al_2O_3$ layer, a TiC layer, and a TiN layer in order from the base material. In the following Table 3, the layer structure of Sample A1 to Sample A8 and the thickness (μm) of each layer are indicated.

TABLE 3

| | Sample No. | layer structure and layer thickness (μm) |
|---|---|---|
| Example | A1 | base material/TiN(0.3)/TiCN(7.5)/TiCNO(1.0)/$Al_2O_3$(3.3)/TiC(0.3)/TiN(0.5) |
| | A2 | base material/TiN(0.3)/TiCN(7.3)/TiCNO(1.1)/$Al_2O_3$(3.1)/TiC(0.3)/TiN(0.5) |
| | A3 | base material/TiN(0.3)/TiCN(8.1)/TiCNO(0.9)/$Al_2O_3$(3.0)/TiC(0.3)/TiN(0.5) |
| Comparative Example | A4 | base material/TiN(0.3)/TiCN(7.5)/TiCNO(1.0)/$Al_2O_3$(3.3)/TiC(0.4)/TiN(0.5) |
| Example | A5 | base material/TiN(0.3)/TiCN(7.5)/TiCNO(1.0)/$Al_2O_3$(3.5)/TiC(0.3)/TiN(0.3) |
| | A6 | base material/TiN(0.3)/TiCN(7.7)/TiCNO(1.0)/$Al_2O_3$(3.3)/TiC(0.2)/TiN(0.5) |
| | A7 | base material/TiN(0.3)/TiCN(7.2)/TiCNO(1.0)/$Al_2O_3$(3.7)/TiC(0.3)/TiN(0.4) |
| | A8 | base material/TiN(0.3)/TiCN(7.1)/TiCNO(0.8)/$Al_2O_3$(3.6)/TiC(0.3)/TiN(0.4) |

<Test Details>

In Example 1, as described above, three samples were prepared for each of Sample A1 to Sample A8. For one of the three samples, the flank face (particularly a site on the flank face at 3 mm from the edge ridgeline) was irradiated with x-ray to measure the TC(006) of the α-$Al_2O_3$ layer. In addition, based on an XRD pattern of the coating obtained from the x-ray irradiation, the number of peak counts ($C_α$) of α-$Al_2O_3$ crystal grains and the number of peak counts ($C_κ$) of κ-$Al_2O_3$ crystal grains were calculated. They were substituted into the above expression (3) to derive the area ratio of the κ-$Al_2O_3$ crystal grains. Further, for another sample, the wear resistance was evaluated. For the remaining one sample, the chipping resistance was evaluated.

The methods of evaluating the wear resistance and the chipping resistance are as follows. The results of the evaluation are indicated in Table 4 below.

<Wear Resistance Test>
Workpiece: SCM435 (JIS)
Cutting Speed: 270 m/min
Feed: 0.35 mm/rev
Depth of Cut: 1.5 mm
Cutting Oil: dry
Cutting Time: 15 min Evaluation: The wear width Vb (mm) of the flank face after cutting was performed for 15 minutes was measured.

The wear resistance is evaluated as follows. A cutting tool of each of Sample A1 to Sample A8 is set on an NC lathe, and the workpiece is cut under the above conditions for a predetermined time. After this, a wear width (Vb) formed on the flank face of the cutting tool is observed to evaluate the wear resistance. A cutting tool with a smaller value of the wear width (Vb) can be evaluated as being higher in wear resistance.

<Chipping Resistance Test>
Workpiece: SCM435 (JIS), grooved material
Cutting Speed: 270 m/min
Feed: 0.25 mm/rev
Depth of Cut: 1.5 mm
Cutting Oil: wet Evaluation: The elapsed time (minutes) before fracture (chipping) was measured.

The chipping resistance is evaluated as follows. A cutting tool of each of Sample A1 to Sample A8 is set on an NC lathe, the workpiece is cut under the above conditions, and the elapsed time before fracture (chipping) occurs to the cutting tool is measured to evaluate the chipping resistance. A cutting tool with a longer elapsed time before occurrence of fracture can be evaluated as being higher in chipping resistance.

TABLE 4

| | Sample No. | XRD result TC(006) | κ-$Al_2O_3$ area ratio (%) | cutting performance wear resistance Vb (mm) | time to fracture (min) | performance rating |
|---|---|---|---|---|---|---|
| Example | A1 | 5.32 | 0.7 | 0.155 | 4.5 | B |
| | A2 | 7.12 | 2.2 | 0.145 | 6.4 | A |
| | A3 | 7.85 | 4.8 | 0.142 | 7.1 | A |
| Comparative Example | A4 | 5.43 | 0.03 | 0.158 | 2.2 | D |
| | A5 | 5.76 | 7.5 | 0.201 | 4.2 | D |
| | A6 | 5.45 | 0.02 | 0.152 | 2.4 | C |
| | A7 | 5.76 | 9.8 | 0.240 | 5.6 | C |
| | A8 | 4.53 | 2.0 | 0.230 | 6.1 | C |

The performance rating represented for example by symbol A in Table 4 is defined as follows.

A: highly excellent in wear resistance and chipping resistance (Vb=0.145 or less, and time to fracture=5 minutes or more)

B: excellent in wear resistance and chipping resistance (Vb=0.155 or less, and time to fracture=4.5 minutes or more)

C: insufficient in wear resistance or chipping resistance (Vb=more than 0.155, or time to fracture=less than 4.5 minutes)

D: more insufficient in wear resistance and chipping resistance (Vb=more than 0.155, and time to fracture=less than 4.5 minutes)

<Results of Evaluation>

As seen from Table 4, Examples corresponding to Sample A1 to Sample A3 exhibit the performance that Vb (mm) is 0.155 or less and the performance that the time to fracture is 4.5 minutes or more and thus can be evaluated as having excellent wear resistance and chipping resistance. Regarding all of Sample A1 to Sample A3, the TC(006) of the α-$Al_2O_3$ layer is more than 5, and the area ratio of the κ-$Al_2O_3$ crystal grains based on the XRD pattern is 0.7 to 4.8%.

In contrast, the Comparative Examples corresponding to Sample A4 to Sample A8 fail to exhibit at least the performance that Vb (mm) is 0.155 or less, or the performance that the time to fracture is 4.5 minutes or more, and are accordingly evaluated as insufficient in wear resistance or chipping resistance. Regarding all of Sample A4 to Sample A7, the TC(006) of the $\alpha$-$Al_2O_3$ layer is more than 5, however, the area ratio of the $\kappa$-$Al_2O_3$ crystal grains based on the XRD pattern is 0.03% or less or 7.5% or more. Regarding Sample A8, the area ratio of the $\kappa$-$Al_2O_3$ crystal grains based on the XRD pattern is 2%, however, the TC(006) of the $\alpha$-$Al_2O_3$ layer is 4.53, namely less than 5.

<Analysis>

As clearly seen from Table 4, the surface-coated cutting tools of the Examples are superior in wear resistance and chipping resistance to the surface-coated cutting tools of the Comparative Examples, and can achieve an extended life.

Example 2

<Preparation of Base Material>

A base material formed of a cemented carbide base material (manufactured by Sumitomo Electric Industries, Ltd.) with a shape of CNMG120408 identical to that of Example 1 was prepared. Prepared base materials were grouped into three groups named Sample B1 to Sample B3. For each group, three base materials were prepared. These base materials had a composition made up of 94.0 wt % of WC, 5.5 wt % of Co, and 0.5 wt % of $Cr_3C_2$. As will be described later herein, Sample B1 is an Example and Sample B2 and sample B3 are Comparative Examples.

<Formation of Coating>

The base materials of Sample B1 to Sample B3 were subjected to honing under the same conditions as those of Example 1 and set in a CVD apparatus, and a coating was formed by the CVD method.

In the process of forming the $\alpha$-$Al_2O_3$ layer by the CVD method, the surface of the TiCNO layer formed on the surface of the TiCN layer was oxidized to cause nucleation of $\alpha$-$Al_2O_3$ crystal grains, and subsequently the $\alpha$-$Al_2O_3$ layer was formed. In particular, for nucleation of $\alpha$-$Al_2O_3$ crystal grains and subsequent formation of the $\alpha$-$Al_2O_3$ layer, the content of CO gas contained in the raw material gas to be introduced was set to 2.2 vol %. Respective contents of the constituent gases including CO gas in the composition of the raw material gas, as well as the temperature in a furnace of the CVD apparatus and the pressure in the furnace are indicated in Table 5 below.

It should be noted that, during nucleation of $\alpha$-$Al_2O_3$ crystal grains, CO gas was introduced with its content momentarily made higher than 2.2 vol %. After this, the raw material gas in which the content of CO gas was set again to 2.2 vol % was used to grow $\alpha$-$Al_2O_3$ crystal grains and form the $\alpha$-$Al_2O_3$ layer.

Particularly in Example 2, Sample B1 to Sample B3 were made different from each other in terms of the period (pulse period) in which CO gas at the momentarily increased content was introduced. Specifically, the pulse period for Sample B1 was three minutes, the pulse period for Sample B2 was one minute, and the pulse period for Sample B3 was four minutes. Moreover, commonly to Sample B1 to B3, the pulse height was 140% with respect to the content of 2.2 vol % of the CO gas, the pulse width was two minutes, and CO gas at the momentarily increased content was introduced twice. These conditions are indicated in Table 5 below.

TABLE 5

| | Sample No. | temperature in furnace (° C.) | pressure in furnace (hPa) | $CO_2$ (vol %) | $O_2$ (vol %) | $AlCl_3$ (vol %) | HCl (vol %) | normal CO (vol %) | pulse height and number of times | pulse width (min) | pulse period (min) |
|---|---|---|---|---|---|---|---|---|---|---|---|
| Example | B1 | 980 | 85 | 1.5 | 0.007 | 1.5 | 4 | 2.2 | 140%, twice | 2.0 | 3 |
| Comparative Example | B2 | 980 | 85 | 1.5 | 0.007 | 1.5 | 4 | 2.2 | 140%, twice | 2.0 | 1 |
| Example | B3 | 980 | 85 | 1.5 | 0.007 | 1.5 | 4 | 2.2 | 140%, twice | 2.0 | 4 |

The layer structure of the coating formed for each of Sample B1 to Sample B3 is made up of a TiN layer, a TiCN layer, a TiCNO layer, an $\alpha$-$Al_2O_3$ layer, a TiC layer, and a TiN layer in order from the base material. In the following Table 6, the layer structure of Sample B1 to Sample B3 and the thickness (μm) of each layer are indicated.

TABLE 6

| | Sample No. | layer structure and layer thickness (μm) |
|---|---|---|
| Example | B1 | base material/TiN(0.3)/TiCN(9.8)/TiCNO(1.0)/$Al_2O_3$(6.2)/TiC(0.3)/TiN(0.5) |
| Comparative | B2 | base material/TiN(0.3)/TiCN(9.8)/TiCNO(1.0)/$Al_2O_3$(6.2)/TiC(0.4)/TiN(0.5) |
| Example | B3 | base material/TiN(0.2)/TiCN(9.7)/TiCNO(1.1)/$Al_2O_3$(6.5)/TiC(0.2)/TiN(0.6) |

<Test Details>

In Example 2, as described above, three samples were prepared for each of Sample B1 to Sample B3. For these three samples, similarly to Example 1, the TC(006) of the $\alpha$-$Al_2O_3$ layer was measured, the area ratio of the $\kappa$-$Al_2O_3$ crystal grains was calculated based on the XRD pattern, and the wear resistance and the chipping resistance were evaluated.

The methods of evaluating the wear resistance and the chipping resistance are as follows. The results of the evaluation are indicated in Table 7 below.

<Wear Resistance Test>
Workpiece: FCD700 (JIS)
Cutting Speed: 150 m/min
Feed: 0.3 mm/rev
Depth of Cut: 1.5 mm
Cutting Oil: wet
Cutting Time: 10 min
Evaluation: The wear width Vb (mm) of the flank face after cutting was performed for 10 minutes was measured.

The wear resistance is evaluated as follows. A cutting tool of each of Sample B1 to Sample B3 is set on an NC lathe, and the workpiece is cut under the above conditions for a predetermined time. After this, a wear width (Vb) formed on the flank face of the cutting tool is observed to evaluate the wear resistance. A cutting tool with a smaller value of the wear width (Vb) can be evaluated as being higher in wear resistance.

<Chipping Resistance Test>
Workpiece: FCD450 (JIS), grooved material
Cutting Speed: 200 m/min
Feed: 0.2 mm/rev
Depth of Cut: 1.5 mm Cutting Oil: wet Evaluation: The elapsed time (minutes) before fracture (chipping) was measured.

The chipping resistance is evaluated as follows. A cutting tool of each of Sample B1 to Sample B3 is set on an NC lathe, the workpiece is cut under the above conditions, and the elapsed time before fracture (chipping) occurs to the cutting tool is measured to evaluate the chipping resistance. A cutting tool with a longer elapsed time before occurrence of fracture can be evaluated as being higher in chipping resistance.

TABLE 7

| | | | κ-Al$_2$O$_3$ | cutting performance | | |
|---|---|---|---|---|---|---|
| | Sample No. | XRD result TC(006) | area ratio (%) | wear resistance Vb (mm) | time to fracture (min) | performance rating |
| Example | B1 | 6.58 | 1.8 | 0.145 | 5.4 | A |
| Comparative | B2 | 5.75 | 7.2 | 0.179 | 3.2 | D |
| Example | B3 | 5.53 | 0.03 | 0.221 | 4.5 | C |

The performance rating represented for example by symbol A in Table 7 is defined as follows.

A: highly excellent in wear resistance and chipping resistance (Vb=0.145 or less, and time to fracture=5 minutes or more)

B: excellent in wear resistance and chipping resistance (Vb=0.155 or less, and time to fracture=4.5 minutes or more)

C: insufficient in wear resistance or chipping resistance (Vb=more than 0.155, or time to fracture=less than 4.5 minutes)

D: more insufficient in wear resistance and chipping resistance (Vb=more than 0.155, and time to fracture=less than 4.5 minutes)

<Results of Evaluation>

As seen from Table 7, the Example corresponding to Sample B1 exhibits the performance that Vb (mm) is 0.145 and the performance that the time to fracture is 5.4 minutes and thus can be evaluated as having excellent wear resistance and chipping resistance. Regarding Sample B1, the TC(006) of the α-Al$_2$O$_3$ layer is more than 5, and the area ratio of the κ-Al$_2$O$_3$ crystal grains based on the XRD pattern is 1.8%. In contrast, the Comparative Examples corresponding to Sample B2 and Sample B3 fail to exhibit the performance that Vb (mm) is 0.155 or less, or the performance that the time to fracture is 4.5 minutes or more, and are accordingly evaluated as insufficient in wear resistance or chipping resistance. Regarding both Sample B2 and Sample B3, the TC(006) of the α-Al$_2$O$_3$ layer is more than 5, however, the area ratio of the κ-Al$_2$O$_3$ crystal grains based on the XRD pattern is 0.03% or 7.2%.

<Analysis>

As clearly seen from Table 7, the surface-coated cutting tools of the Examples are superior in wear resistance and chipping resistance to the surface-coated cutting tools of the Comparative Examples, and can achieve an extended life.

Example 3

<Preparation of Base Material>

A base material formed of a cemented carbide base material (manufactured by Sumitomo Electric Industries, Ltd.) with a shape of CNMG120408 identical to that of Example 1 was prepared. Prepared base materials were grouped into six groups named Sample C1 to Sample C6. For each group, four base materials were prepared. These base materials had a composition made up of 89.0 wt % of WC, 6.0 wt % of Co, 2.5 wt % of TiC, 1.5 wt % of NbC, and 1.0 wt % of ZrC. As will be described later herein, Sample C1 to Sample C4 are Examples and Sample C5 and Sample C6 are Comparative Examples.

<Formation of Coating>

The base materials of Sample C1 to Sample C6 were subjected to honing under the same conditions as those of Example 1 and set in a CVD apparatus, and a coating was formed by the CVD method.

In the process of forming the α-Al$_2$O$_3$ layer by the CVD method, the surface of the TiCNO layer formed on the surface of the TiCN layer was oxidized to cause nucleation of α-Al$_2$O$_3$ crystal grains, and subsequently the α-Al$_2$O$_3$ layer was formed. For nucleation of α-Al$_2$O$_3$ crystal grains and subsequent formation of the α-Al$_2$O$_3$ layer (growth of crystal grains), the content of CO gas contained in the raw material gas to be introduced was set to 2 vol % similarly to Example 1. Further, during nucleation of α-Al$_2$O$_3$ crystal grains, CO gas with its content temporarily increased to be higher than 2 vol % (2.8 vol %, namely a pulse height of 140%) was introduced three times. Further, the pulse width was set to 0.9 minutes and the pulse period was set to five minutes. Respective contents of the constituent gases in the composition of the raw material gas, as well as the temperature in a furnace of the CVD apparatus and the pressure in the furnace are indicated in Table 8 below. Sample C1 to Sample C6 are identical to each other in terms of the temporarily increased content of the CO gas, the number of times CO gas at the temporarily increased content is introduced, the pulse width, and the pulse period, during nucleation of α-Al$_2$O$_3$ crystal grains.

Subsequently, during formation of the α-Al$_2$O$_3$ layer (growth of crystal grains), feeding of CO$_2$ gas (1 vol %) contained in the raw material gas was temporarily stopped at the time when the α-Al$_2$O$_3$ layer was formed to a thickness of 50 to 90% relative to a desired thickness depending on each sample. After this, the content of CO$_2$ gas was set to the original content, namely 1 vol %. Formation of the α-Al$_2$O$_3$ layer from the raw material gas having the above-described composition was continued to thereby obtain the desired thickness. For example, the desired thickness of the α-Al$_2$O$_3$ layer is 5.4 μm in the case of Sample C1. Therefore, during the formation of the α-Al$_2$O$_3$ layer, feeding of CO$_2$ gas contained in the raw material gas was stopped for 30 seconds when the α-Al$_2$O$_3$ layer was formed to a thickness of 4.4 μm, namely 81.5% relative to the desired thickness. After this, the content of CO$_2$ gas was set to the original content of 1 vol %. With the raw material gas having the composition as shown in FIG. 8, formation of the α-Al$_2$O$_3$ layer was continued to obtain a thickness of the α-Al$_2$O$_3$ layer of 5.4 μm. The time for which feeding of CO$_2$ gas was temporarily stopped for Sample C1 to Sample C6 is indicated in the column "CO$_2$ suspension time (sec)" in Table 8.

TABLE 8

| | Sample No. | temperature in furnace (° C.) | pressure in furnace (hPa) | CO$_2$ (vol %) | O$_2$ (vol %) | AlCl$_3$ (vol %) | HCl (vol %) | CO (vol %) | CO$_2$ suspension time (sec) |
|---|---|---|---|---|---|---|---|---|---|
| Example | C1 | 970 | 70 | 1 | 0.003 | 2 | 3 | 2 | 60 |
| | C2 | 970 | 70 | 1 | 0.003 | 2 | 3 | 2 | 40 |

TABLE 8-continued

|  | Sample No. | temperature in furnace (° C.) | pressure in furnace (hPa) | $CO_2$ (vol %) | $O_2$ (vol %) | $AlCl_3$ (vol %) | HCl (vol %) | CO (vol %) | $CO_2$ suspension time (sec) |
|---|---|---|---|---|---|---|---|---|---|
|  | C3 | 970 | 70 | 1 | 0.003 | 2 | 3 | 2 | 30 |
|  | C4 | 970 | 70 | 1 | 0.003 | 2 | 3 | 2 | 70 |
| Comparative | C5 | 970 | 70 | 1 | 0.003 | 2 | 3 | 2 | 20 |
| Example | C6 | 970 | 70 | 1 | 0.003 | 2 | 3 | 2 | 80 |

The layer structure of the coating formed for each of Sample C1 to Sample C6 is made up of a TiN layer, a TiCN layer, a TiCNO layer, an $\alpha\text{-}Al_2O_3$ layer, a TiC layer, and a TiN layer in order from the base material. In the following Table 9, the layer structure of Sample C1 to Sample C6 and the thickness (μm) of each layer are indicated.

TABLE 9

|  | Sample No. | layer structure and layer thickness (μm) |
|---|---|---|
| Example | C1 | base material/TiN(0.2)/TiCN(7.9)/TiCNO(1.0)/$Al_2O_3$ (5.4)/TiC(0.3)/TiN(0.5) |
|  | C2 | base material/TiN(0.2)/TiCN(8.0)/TiCNO(1.0)/$Al_2O_3$ (5.3)/TiC(0.3)/TiN(0.5) |
|  | C3 | base material/TiN(0.2)/TiCN(7.8)/TiCNO(0.9)/$Al_2O_3$ (5.6)/TiC(0.3)/TiN(0.5) |
|  | C4 | base material/TiN(0.3)/TiCN(7.5)/TiCNO(0.9)/$Al_2O_3$ (6.0)/TiC(0.2)/TiN(0.4) |
| Comparative | C5 | base material/TiN(0.2)/TiCN(8.1)/TiCNO(0.9)/$Al_2O_3$ (5.2)/TiC(0.2)/TiN(0.6) |
| Example | C6 | base material/TiN(0.2)/TiCN(8.0)/TiCNO(0.9)/$Al_2O_3$ (5.0)/TiC(0.2)/TiN(0.5) |

<Test Details>
In Example 3, as described above, four samples were prepared for each of C1 to C6. Three samples out of the four samples were used to measure the TC(006) of the $\alpha\text{-}Al_2O_3$ layer, calculate the area ratio of the $\kappa\text{-}Al_2O_3$ crystal grains based on the XRD pattern, and evaluate the wear resistance and the chipping resistance, similarly to Example 1.

The methods of evaluating the wear resistance and the chipping resistance are as follows.

<Wear Resistance Test>
Workpiece: SCM435 (JIS)
Cutting Speed: 320 m/min
Feed: 0.25 mm/rev
Depth of Cut: 1.5 mm
Cutting Oil: dry
Cutting Time: 15 min
Evaluation: The wear width Vb (mm) of the flank face after cutting was performed for 15 minutes was measured.

The wear resistance is evaluated as follows. A cutting tool of each of Sample C1 to Sample C6 is set on an NC lathe, and the workpiece is cut under the above conditions for a predetermined time. After this, a wear width (Vb) formed on the flank face of the cutting tool is observed to evaluate the wear resistance. A cutting tool with a smaller value of the wear width (Vb) can be evaluated as being higher in wear resistance.

<Chipping Resistance Test>
Workpiece: SCM435 (JIS), grooved material
Cutting Speed: 250 m/min
Feed: 0.2 mm/rev
Depth of Cut: 1.5 mm
Cutting Oil: wet
Evaluation: The elapsed time (minutes) before fracture (chipping) was measured.

The chipping resistance is evaluated as follows. A cutting tool of each of Sample C1 to Sample C6 is set on an NC lathe, the workpiece is cut under the above conditions, and the elapsed time before fracture (chipping) occurs to the cutting tool is measured to evaluate the chipping resistance. A cutting tool with a longer elapsed time before occurrence of fracture can be evaluated as being higher in chipping resistance.

Further, in Example 3, for the remaining one sample of each of Sample C1 to Sample C6, the coating was cut in the normal direction to the surface of the base material, and the resultant cross section was analyzed with the FE-SEM (trademark: "SU6600" manufactured by Hitachi High-Technologies Corporation) equipped with an EBSD apparatus based on the above-described method. Thus, the area ratios X and Y of the $\kappa\text{-}Al_2O_3$ crystal grains to all $Al_2O_3$ crystal grains in a measurement field of view in respective two regions of the $\alpha\text{-}Al_2O_3$ layer were calculated. The results of the evaluation above are indicated in Table 10 below.

In the present Example, the area ratio X refers to the area ratio of the $\kappa\text{-}Al_2O_3$ crystal grains to all $Al_2O_3$ crystal grains in a measurement field of view in a region from the front surface of the $\alpha\text{-}Al_2O_3$ layer (namely from the interface between the $\alpha\text{-}Al_2O_3$ layer and the TiC layer) inward to a depth of 1 μm. The area ratio Y refers to the area ratio of the $\kappa\text{-}Al_2O_3$ crystal grains to all $Al_2O_3$ crystal grains in a measurement field of view in a region beyond the region from the front surface of the $\alpha\text{-}Al_2O_3$ layer (namely from the interface between the $\alpha\text{-}Al_2O_3$ layer and the TIC layer) inward to the depth of 1 μm.

The cross section formed for calculating the area ratios X and Y of the $\kappa\text{-}Al_2O_3$ crystal grains was polished with waterproof abrasive paper and subsequently further smoothed by ion milling with Ar ions. Thus, the cross section was prepared. The ion milling apparatus and the conditions for the ion milling are as follows.

ion milling apparatus (trademark: "SM-09010" manufactured by JEOL Ltd.)
acceleration voltage: 6 kV
ion beam incident angle: 0° from the direction normal to the front surface of the base material
ion beam irradiation time: 6 hours

TABLE 10

|  |  | XRD | | κ alumina | | cutting performance | | |
|---|---|---|---|---|---|---|---|---|
|  | Sample No. | result TC(006) | overall ratio (%) | area ratio X (%) | area ratio Y (%) | wear resistance Vb (mm) | time to fracture (min) | performance rating |
| Example | C1 | 7.12 | 0.9 | 4.86 | <0.001 | 0.165 | 6.4 | A |
|  | C2 | 7.34 | 0.08 | 0.42 | <0.001 | 0.157 | 4.6 | B |

TABLE 10-continued

| | Sample No. | XRD result TC(006) | κ alumina | | | cutting performance | | |
| --- | --- | --- | --- | --- | --- | --- | --- | --- |
| | | | overall ratio (%) | area ratio X (%) | area ratio Y (%) | wear resistance Vb (mm) | time to fracture (min) | performance rating |
| | C3 | 5.01 | 0.06 | 0.09 | 0.054 | 0.168 | 4.7 | B |
| | C4 | 5.5 | 3.5 | 21 | <0.001 | 0.186 | 4.8 | B |
| Comparative | C5 | 4.23 | 0.02 | 0.03 | 0.017 | 0.157 | 2.1 | C |
| Example | C6 | 5.64 | 9.0 | 45 | <0.001 | 0.234 | 5.6 | C |

The performance rating represented for example by symbol A in Table 10 is defined as follows.

A: highly excellent in wear resistance and chipping resistance (Vb=0.165 or less, and time to fracture=5 minutes or more)

B: excellent in wear resistance and chipping resistance (Vb=more than 0.165 and 0.200 or less, and time to fracture=3 minutes or more and less than 5 minutes)

C: insufficient in wear resistance or chipping resistance (Vb=more than 0.200, or time to fracture=less than 3 minutes)

<Results of Evaluation>

As seen from Table 10, Examples corresponding to Sample C1 to Sample C4 exhibit the performance that Vb (mm) is 0.200 or less and the performance that the time to fracture is 3 minutes or more and thus can be evaluated as having excellent wear resistance and chipping resistance. Regarding all of Sample C1 to Sample C4, the TC(006) of the $\alpha$-$Al_2O_3$ layer is more than 5, and the area ratio of the $\kappa$-$Al_2O_3$ crystal grains based on the XRD pattern is 0.06 to 3.5%.

In particular, regarding Sample C1 and Sample C2, the area ratio X of the $\kappa$-$Al_2O_3$ crystal grains to all $Al_2O_3$ crystal grains in a measurement field of view in a region from a front surface of the $\alpha$-$Al_2O_3$ layer inward to a depth of 1 μm is 0.1 to 20%. Therefore, Sample C1 and Sample C2 can be evaluated as having further excellent wear resistance and chipping resistance relative to Sample C3 and Sample C4.

In contrast, the Comparative Examples corresponding to Sample C5 and Sample C6 are evaluated as inferior in performance to the Examples corresponding to Sample C1 to C4, and insufficient in wear resistance or chipping resistance. Regarding Sample C5, the TC(006) of the $\alpha$-$Al_2O_3$ layer is less than 5. Further, the area ratio of the $\kappa$-$Al_2O_3$ crystal grains based on the XRD pattern is 0.03 or less. Regarding Sample C6, while the TC(006) of the $\alpha$-$Al_2O_3$ layer is 5 or more, the area ratio of the $\kappa$-$Al_2O_3$ crystal grains based on the XRD pattern is 9%. Regarding both Sample C5 and Sample C6, the area ratio X of the $\kappa$-$Al_2O_3$ crystal grains to all $Al_2O_3$ crystal grains in a measurement field of view in a region from the front surface of the $\alpha$-$Al_2O_3$ layer inward to a depth of 1 μm is out of a range of 0.1 to 20%.

<Analysis>

As clearly seen from Table 10, the surface-coated cutting tools of the Examples are superior in wear resistance and chipping resistance to the surface-coated cutting tools of the Comparative Examples, and can achieve an extended life.

While the embodiment and examples of the present invention have been described above, it is originally intended that the above-described features of the embodiment and examples may be combined as appropriate or modified in various manners.

It should be construed that the embodiment disclosed herein is given by way of example in all respects, not by way of limitation. It is intended that the scope of the present invention is defined by claims, not by the above-described embodiment, and encompasses all modifications equivalent in meaning and scope to the claims.

REFERENCE SIGNS LIST

1 first peak; 2 second peak; 3 third peak; 4 fourth peak; 5 fifth peak; 6 sixth peak; 7 seventh peak

The invention claimed is:

1. A surface-coated cutting tool comprising a base material and a coating formed on the base material,
the coating including an $\alpha$-$Al_2O_3$ layer,
the $\alpha$-$Al_2O_3$ layer containing a plurality of $\alpha$-$Al_2O_3$ crystal grains and a plurality of $\kappa$-$Al_2O_3$ crystal grains, and having a TC(006) of more than 5 in a texture coefficient TC(hkl),
a ratio of $C_\kappa$ to a sum of $C_\alpha$ and $C_\kappa$: $[C_\kappa/(C_\alpha+C_\kappa)\times 100]$ (%) being 0.05 to 7%, where $C_\alpha$ is a total number of peak counts of the $\alpha$-$Al_2O_3$ crystal grains obtained from measurement data of x-ray diffraction for the coating, and $C_\kappa$ is a total number of peak counts of the $\kappa$-$Al_2O_3$ crystal grains obtained from the measurement data of the x-ray diffraction for the coating,
in the $\alpha$-$Al_2O_3$ layer, an area ratio X of the $\kappa$-$Al_2O_3$ crystal grains to all $Al_2O_3$ crystal grains in a measurement field of view being 0.1 to 20%, the measurement field of view being derived from an analysis with an electron backscatter diffraction apparatus for a region from a front surface of the $\alpha$-$Al_2O_3$ layer inward to a depth of 1 μm, and
in the $\alpha$-$Al_2O_3$ layer, an area ratio Y of the $\kappa$-$Al_2O_3$ crystal grains to all $Al_2O_3$ crystal grains in a measurement field of view being smaller than the area ratio X, the measurement field of view being derived from an analysis with the electron backscatter diffraction apparatus for a region beyond the region from the front surface of the $\alpha$-$Al_2O_3$ layer inward to the depth of 1 μm.

2. The surface-coated cutting tool according to claim 1, wherein
the $\alpha$-$Al_2O_3$ layer has an average layer thickness of 2 to 15 μm.

3. The surface-coated cutting tool according to claim 1, wherein in a surface of the coating, an outermost surface layer in which any one of Ti carbide, Ti nitride, and Ti boride is a main component is disposed.

4. The surface-coated cutting tool according to claim 1, wherein
the coating has an intermediate layer between the $\alpha$-$Al_2O_3$ layer and the base material,
the intermediate layer contains acicular TiCNO or acicular TiBN and has an average layer thickness of 0.3 to 1 μm, and a difference between a maximum thickness and a minimum thickness of the intermediate layer is 0.3 μm or more.

* * * * *